United States Patent
Kubota et al.

(10) Patent No.: US 8,630,047 B2
(45) Date of Patent: Jan. 14, 2014

(54) IMAGING LENS

(75) Inventors: Yoji Kubota, Nagano (JP); Kenichi Kubota, Nagano (JP); Hitoshi Hirano, Nagano (JP); Ichiro Kurihara, Tochigi (JP); Yoshio Ise, Tochigi (JP)

(73) Assignees: Optical Logic Inc., Nagano (JP); Kantatsu Co., Ltd., Tochigi (JP)

( * ) Notice: Subject to any disclaimer, the term of this patent is extended or adjusted under 35 U.S.C. 154(b) by 1 day.

(21) Appl. No.: 13/557,404

(22) Filed: Jul. 25, 2012

(65) Prior Publication Data
US 2013/0050852 A1 Feb. 28, 2013

(30) Foreign Application Priority Data
Aug. 22, 2011 (JP) ................................ 2011-180494

(51) Int. Cl.
*G02B 9/16* (2006.01)
*G02B 3/02* (2006.01)

(52) U.S. Cl.
USPC .......................................... 359/785; 359/716

(58) Field of Classification Search
CPC .............................. G02B 13/0035; G02B 9/16
USPC ................... 348/335, 340; 359/716, 784, 785
See application file for complete search history.

(56) References Cited

U.S. PATENT DOCUMENTS

| | | | |
|---|---|---|---|
| 8,184,385 B2 * | 5/2012 | Chen et al. ..................... | 359/716 |
| 8,194,172 B2 * | 6/2012 | Tang et al. ..................... | 348/340 |
| 8,355,213 B2 * | 1/2013 | Tang et al. ..................... | 359/716 |
| 8,427,759 B2 * | 4/2013 | Kubota et al. .................. | 359/716 |
| 8,508,866 B2 * | 8/2013 | Teraoka ........................ | 359/785 |

FOREIGN PATENT DOCUMENTS

JP 2008-076594 A 4/2008

* cited by examiner

*Primary Examiner* — David N Spector
(74) *Attorney, Agent, or Firm* — Kobotera & Associates, LLC

(57) ABSTRACT

An imaging lens includes a first lens; a second lens; and a third lens. A curvature radius of an object-side surface and an image plane-side surface of the first lens is positive. The second lens is formed such that a curvature radius of an object-side surface is negative and a curvature radius of an image plane-side surface is positive. A curvature radius of an object-side surface and an image plane-side surface of the third lens is positive. When the first lens has a focal length f1, the second lens has a focal length f2, the third lens has a focal length f3, a composite focal length of the first lens and the second lens is f12, and a composite focal length of the second lens and the third lens is f23, the imaging lens satisfies the following expressions:

$f1 < |f2|$ $f1 < f3$ $-1.0 < f12/f23 < -0.1$.

5 Claims, 15 Drawing Sheets

IMAGING LENS

BACKGROUND OF THE INVENTION AND RELATED ART STATEMENT

The present invention relates to an imaging lens for forming an image on an imaging element such as a CCD sensor and a CMOS sensor. In particular, the present invention relates to an imaging lens suitable for mounting in a relatively small camera such as a cellular phone, a digital still camera, a portable information terminal, a security camera, an onboard camera, and a network camera.

An imaging lens for mounting in a small-sized camera requires a lens configuration with high resolution that can be suitably applied in an imaging element of high resolution that is available in these years, in addition to having a small size. Conventionally, there have been various proposals for lens configurations, and among them, an imaging lens with a three-lens configuration has been used in many cameras since such an imaging lens can relatively satisfactorily correct aberrations and is suitable for miniaturization.

For such an imaging lens with a three-lens configuration, for example, an imaging lens described in Patent Reference has been known. The imaging lens includes a first lens having positive refractive power; a second lens having negative refractive power; and a third lens having positive refractive power, arranged in the order from an object side. According to the configuration, the third lens has shorter focal length than that of the whole lens system, i.e., the third lens has relatively strong refractive power. At the same time, the second lens has stronger refractive power than that of the first lens so as to correct field curvature, coma aberration, and so on.

Patent Reference Japanese Patent Application Publication No. 2008-76594

In recent years, there have been rapid advancements in miniaturization and higher resolution of cameras as well as cellular phones, and demands for performances of imaging lenses have been even higher than before. According to the conventional imaging lens described in Patent Reference, it is possible to relatively satisfactorily correct aberrations. Since the whole lens system has a long focal length, however, the length of the imaging lens on an optical axis tends to be long, and there is limitation in miniaturization of the imaging lens.

Here, such a requirement of attaining both miniaturization and aberration correction is not a challenge specific to the imaging lens for mounting in a cellular phone, but also a challenge for an imaging lens for mounting in a relatively small camera, such as digital still cameras, portable information terminals, security cameras, onboard cameras, and network cameras.

In view of the above-described problems in the conventional techniques, an object of the present invention is to provide an imaging lens that can satisfactorily correct aberrations despite of a small size thereof.

Further objects and advantages of the invention will be apparent from the following description of the invention.

SUMMARY OF THE INVENTION

In order to attain the objects described above, according to a first aspect of the invention, an imaging lens includes a first lens having positive refractive power; a second lens having negative refractive power; and a third lens having positive refractive power, arranged in the order from an object side to an image plane side. The first lens has a shape so that a curvature radius of an object-side surface thereof and a curvature radius of an image plane-side surface thereof are both positive. The second lens has a shape so that a curvature radius of an object-side surface thereof is negative and a curvature radius of an image plane-side surface thereof is positive. The third lens has a shape so that a curvature radius of an object-side surface thereof and a curvature radius of an image plane-side surface are both positive.

According to the first aspect of the present invention, when the first lens has a focal length f1, the second lens has a focal length f2, the third lens has a focal length f3, a composite focal length of the first lens and the second lens is f12, and a composite focal length of the second lens and the third lens is f23, the imaging lens of the invention satisfies the following conditional expressions (1) to (3):

$$f1 < |f2| \quad (1)$$

$$f1 < f3 \quad (2)$$

$$-1.0 < f12/f23 < -0.1 \quad (3)$$

When the imaging lens satisfies the conditional expressions (1) and (2), it is possible to shorten a length of the imaging lens on an optical axis and attain miniaturization of the imaging lens. According to the first aspect of the invention, in the imaging lens, the first lens is formed in the shape so that the curvature radius of the object-side surface thereof and the curvature radius of the image plane-side surface thereof are both positive, i.e., a shape of a meniscus lens directing a convex surface thereof to the object side near the optical axis. With such a shape of the first lens, a position of a principal point of the first lens moves to the object side.

In addition, as shown in the conditional expressions (1) and (2), according to the first aspect of the present invention, in the imaging lens, among three lenses that compose the lens system, the first lens has stronger refractive power than the other two lenses. For this reason, a position of the principal point of the lens system moves to the object side, and thereby it is possible to suitably attain miniaturization of the imaging lens.

When the imaging lens satisfies the conditional expressions (3), it is possible to attain miniaturization of the imaging lens and satisfactorily correct field curvature and distortion. When the value exceeds the upper limit "−0.1", although it is advantageous for miniaturization of the imaging lens, the lens system has a short back focal length, so that it is difficult to secure a space to dispose an insertion piece, such as an infrared cut-off filter and a cover glass, between the imaging lens and an imaging element. Furthermore, since the third lens has relatively weak refractive power, among astigmatisms, an aberration of a sagittal image surface increases in a positive direction (to the image plane side), so that an image forming surface tilts to the image plane side. Therefore, it is difficult to obtain satisfactory image forming performance. Here, in this case, since an incident angle of a light beam emitted from the imaging lens to the imaging element is large, a light beam emitted from the imaging lens may not be fully taken in the imaging element in some models of the imaging element, so that there remains a concern of so-called shading phenomenon.

On the other hand, when the value is below the lower limit "−1.0", the lens system has a long back focal length, so that, although it is easy to secure a space to dispose the above-described insertion piece, it is difficult to attain miniaturization of the imaging lens. In addition, since the image forming surface tilts to the object side and a negative distortion increases, it is difficult to obtain satisfactory image forming performance.

According to a second aspect of the present invention, in the imaging lens having the above-described configuration, when the third lens has a thickness D3 on the optical axis and a distance on the optical axis from the object-side surface of the first lens to the image plane-side surface of the third lens is L13, the imaging lens preferably satisfies the following conditional expression (4):

$$0.25 < D3/L13 < 0.5 \quad (4)$$

When the imaging lens satisfies the conditional expression (4), it is possible to satisfactorily correct distortion, field curvature, and chromatic aberration of magnification. When the value exceeds the upper limit "0.5", a chromatic aberration of magnification of an off-axis light beam is insufficiently corrected (an image-forming point at a short wavelength moves in a direction that approaches the optical axis in relative to an image-forming point at a reference wavelength) and a negative distortion increases. On the other hand, when the value is below the lower limit "0.25", although it is advantageous for correcting distortion, since the sagittal image surface curves to the object side, the field curvature is insufficiently corrected. Therefore, in either case, it is difficult to obtain satisfactory image forming performance.

According to a third aspect of the present invention, the imaging lens having the above-described configuration preferably satisfies the following conditional expression (5):

$$-1.0 < f1/f2 < -0.5 \quad (5)$$

When the imaging lens satisfies the conditional expression (5), it is possible to restrain an axial chromatic aberration, an off-axis chromatic aberration of magnification, and field curvature within satisfactory ranges while attaining miniaturization of the imaging lens. When the value exceeds the upper limit "−0.5", since the first lens has strong refractive power in relative to the second lens, although it is advantageous for attaining miniaturization of the imaging lens, the axial chromatic aberration is insufficiently corrected (a position of a focal point at a short wavelength moves to the object side in relative to a position of a focal point at a reference wavelength) and off-axis chromatic aberration of magnification is insufficiently corrected. Moreover, since the image forming surface tilts to the object side, it is difficult to obtain satisfactory image forming performance.

On the other hand, when the value is below the lower limit "−1.0", although it is advantageous for correcting an axial chromatic aberration, the off-axis chromatic aberration of magnification is excessively corrected (an image forming point at a short wavelength moves in a direction to be away from the optical axis in relative to an image forming point at a reference wavelength). In addition, since the image forming surface tilts to the image plane side, it is difficult to obtain satisfactory image forming performance.

According to a fourth aspect of the present invention, when a curvature radius of the object-side surface of the second lens is Rf and a curvature radius of the image plane-side surface thereof is Rr, the imaging lens having the above-described configuration preferably satisfies the following conditional expression (6):

$$-0.30 < Rf/Rr < 0 \quad (6)$$

When the imaging lens satisfies the conditional expression (6), it is possible to restrain a coma aberration within satisfactory range while attaining miniaturization of the imaging lens. When the value exceeds the upper limit "0", a position of a principal point of the lens system moves to the image plane side, so that it is difficult to attain miniaturization of the imaging lens. On the other hand, when the value is below the lower limit "−0.30", a position of a principal point of the lens system moves to the object side, so that, although it is advantageous for miniaturization of the imaging lens, the image forming surface tilts to the image plane side and an outer coma aberration increases. For this reason, it is difficult to obtain satisfactory image forming performance.

Furthermore, in order to restrain the coma aberration within more satisfactory range while attaining miniaturization of the imaging lens, the imaging lens having the above-described configuration preferably satisfies the following conditional expression (6A):

$$-0.15 < Rf/Rr < 0 \quad (6A)$$

According to a fifth aspect of the present invention, when a distance on the optical axis between the first lens and the second lens is dA and a distance on the optical axis between the second lens and the third lens is dB, the imaging lens having the above-described configuration preferably satisfies the following conditional expression (7):

$$1.0 < dA/dB < 3.0 \quad (7)$$

When the imaging lens satisfies the conditional expression (7), it is possible to restrain distortion, field curvature, and chromatic aberration of magnification within satisfactory ranges. When the value exceeds the upper limit "3.0", the second lens moves to the image plane side, so that, although an incident angle of a light beam that is emitted from the imaging lens to the imaging element is small, a negative distortion increases. In addition, a sagittal image surface curves to the object side and the field curvature is insufficiently corrected. For this reason, it is difficult to obtain satisfactory image-forming performance.

On the other hand, when the value is below the lower limit "1.0", the second lens moves toward the object side. Accordingly, a back focal length thereof is long and it is easy to secure space for disposing an insertion such as infrared cut filter, but the off-axis chromatic aberration of magnification is insufficiently corrected. In addition, since an astigmatic difference also increases, it is difficult to obtain satisfactory image-forming performance.

Moreover, in order to restrain the distortion, the field curvature, and the chromatic aberration of magnification within more satisfactory ranges, the imaging lens having the above-described configuration preferably satisfies the following conditional expression (7A):

$$1.0 < dA/dB < 2.5 \quad (7A)$$

According to the imaging lens of the invention, it is possible to attain both miniaturization of an imaging lens and satisfactory aberration correction and provide a small-sized imaging lens with satisfactorily corrected aberrations.

DETAILED DESCRIPTION OF PREFERRED EMBODIMENTS

Hereunder, referring to the accompanying drawings, an embodiment of the present invention will be fully described.

FIGS. 1, 4, 7, 10, and 13 are sectional views of image lenses in Numerical Data Examples 1 to 5 according to the embodiment, respectively. Since a basic lens configuration is the same among the Numerical Data Examples, the lens configuration of the embodiment will be described with reference to the schematic sectional view of Numerical Data Example 1.

Figure 1:
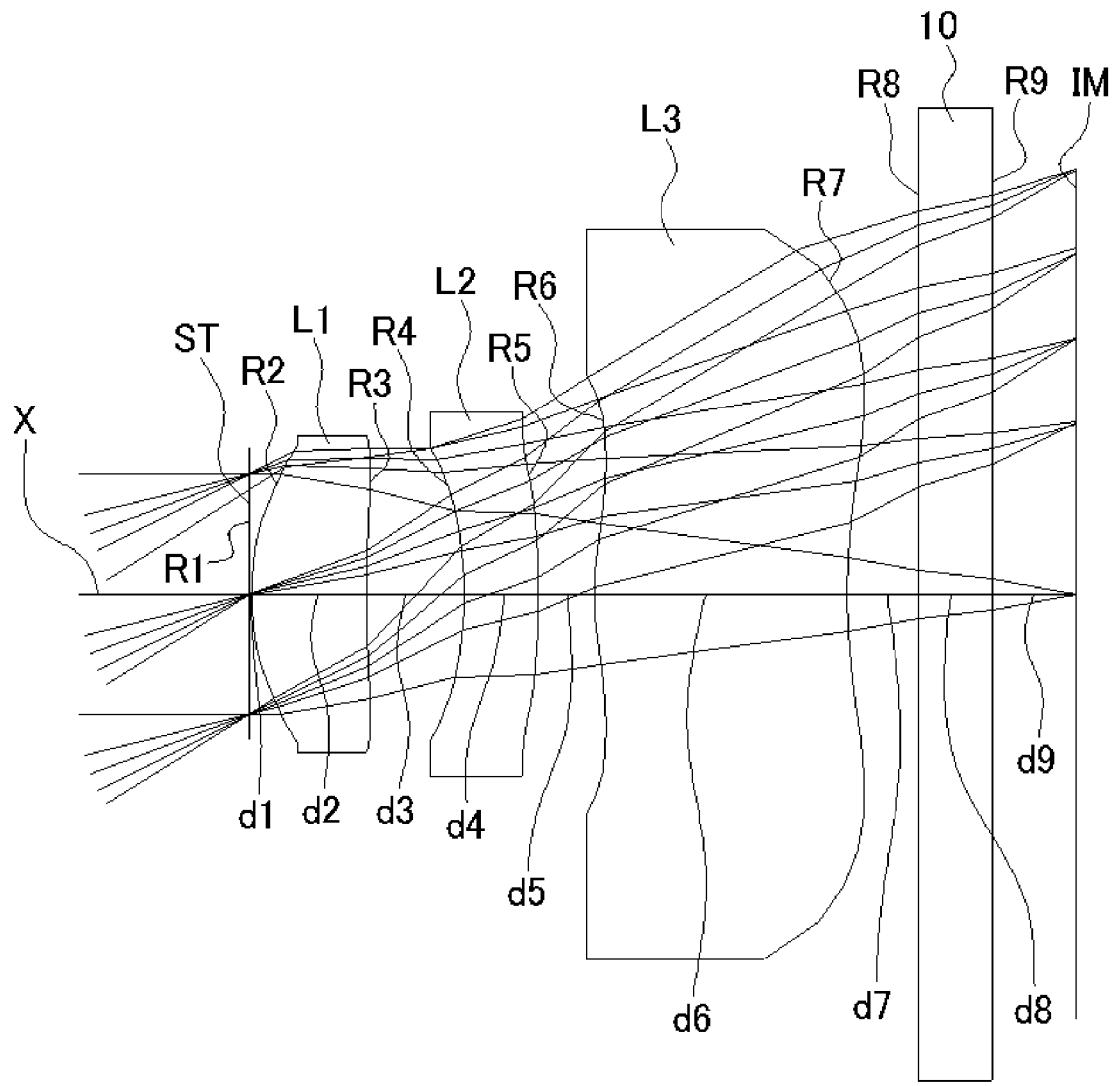
FIG. 1 is a sectional view showing a schematic configuration of an imaging lens of Numerical Data Example 1 according to an embodiment of the invention.

As shown in FIG. 1, the imaging lens of the embodiment has an aperture stop ST; a first lens L1 having positive refractive power; a second lens L2 having negative refractive power; and a third lens L3 having positive refractive power, arranged in this order from an object side to an image plane side. A filter 10 is provided between the third lens L3 and an image plane IM of an imaging element. Here, the filter 10 may be optionally omitted.

The first lens L1 is formed in a shape so that a curvature radius of an object-side surface thereof and a curvature radius of an image plane-side surface thereof are both positive, i.e. a shape of a meniscus lens directing a convex surface thereof to the object side near the optical axis X. The second lens L2 is formed in a shape so that a curvature radius of an object-side surface thereof is negative and a curvature radius of the image plane-side surface thereof is positive, i.e. a shape of a biconcave lens near an optical axis X. The third lens L3 is formed in a shape so that a curvature radius of an object-side surface and a curvature radius of an image plane-side surface are both positive, i.e. a shape of a meniscus lens directing a convex surface thereof to the object side near the optical axis X. Here, according to the embodiment, the third lens L3 is formed as an aspheric shape so that the object-side surface thereof and the image plane-side surface thereof are both convex to the object side near the optical axis X and concave to the object side at the periphery.

Furthermore, the imaging lens of the embodiment satisfies the following conditional expressions (1) to (7):

$$f1 < |f2| \tag{1}$$

$$f1 < f3 \tag{2}$$

$$-1.0 < f12/f23 < -0.1 \tag{3}$$

$$0.25 < D3/L13 < 0.5 \tag{4}$$

$$-1.0 < f1/f2 < -0.5 \tag{5}$$

$$-0.30 < Rf/Rr < 0 \tag{6}$$

$$1.0 < dA/dB < 3.0 \tag{7}$$

In the above conditional expressions,
f1: Focal length of a first lens L1
f2: Focal length of a second lens L2
f3: Focal length of a third lens L3
f12: Composite focal length of the first lens L1 and the second lens L2
f23: Composite focal length of the second lens L2 and the third lens L3
D3: Thickness of the third lens L3 on an optical axis
L13: Distance on the optical axis from an object-side surface of the first lens L1 and an image plane-side surface of the third lens L3
Rf: Curvature radius of an object-side surface of the second lens L2
Rr: Curvature radius of an image plane-side surface of the second lens L2
dA: Distance on the optical axis between the first lens L1 and the second lens L2
dB: Distance on the optical axis between the second lens L2 and the third lens L3

In order to restrain aberrations within more satisfactory ranges while attaining miniaturization of the imaging lens, the imaging lens of the embodiment further satisfies the following conditional expressions (6A) and (7A):

$$-0.15 < Rf/Rr < 0 \tag{6A}$$

$$1.0 < dA/dB < 2.5 \tag{7A}$$

Here, it is not necessary to satisfy all of the conditional expressions. When any single one of the conditional expressions is individually satisfied, it is possible to obtain an effect corresponding to the respective conditional expression.

In the embodiment, any lens surfaces of the lenses, the first lens L1 to the third lens L3, are formed as an aspheric surface. When the aspheric surfaces applied to the lens surfaces have an axis Z in the optical axis direction, a height H in a direction perpendicular to the optical axis, a conical coefficient k, and aspheric coefficients $A_4$, $A_6$, $A_8$, $A_{10}$, $A_{12}$, $A_{14}$, and $A_{16}$, the aspheric surfaces of the lens surfaces may be expressed as follows:

$$Z = \frac{\frac{H^2}{R}}{1+\sqrt{1-(k+1)\frac{H^2}{R^2}}} + A_4 H^4 + A_6 H^6 + A_8 H^8 + A_{10} H^{10} + A_{12} H^{12} + A_{14} H^{14} + A_{16} H^{16} \quad [\text{Formula 1}]$$

Next, Numerical Data Examples of the embodiment will be described. In each of the Numerical Data Examples, f represents a focal length of a whole lens system, Fno represents an F number, and ω represents a half angle of view, respectively. In addition, i represents a surface number counted from the object side, R represents a curvature radius, d represents a distance between lens surfaces (surface spacing) on the optical axis, Nd represents a refractive index for a d line (reference wavelength), and vd represents Abbe's number for the d line, respectively. Here, aspheric surfaces are indicated with surface numbers i affixed with * (asterisk).

Numerical Data Example 1

Basic lens data are shown below.

f = 2.82 mm, Fno = 2.9, ω = 31.9°
Unit: mm

Surface Data

| Surface Number i | R | d | Nd | vd |
|---|---|---|---|---|
| (Object) | ∞ | ∞ | | |
| 1 (Stop) | ∞ | 0.010 | | |
| 2* | 1.066 | 0.473 | 1.5250 | 56.0 |
| 3* | 6.675 | 0.403 (=dA) | | |
| 4* | −1.881 (=Rf) | 0.300 | 1.6142 | 26.0 |
| 5* | 111.996 (=Rr) | 0.233 (=dB) | | |
| 6* | 1.355 | 1.036 (=D3) | 1.5250 | 56.0 |
| 7* | 2.078 | 0.300 | | |
| 8 | ∞ | 0.300 | 1.5163 | 64.1 |
| 9 | ∞ | 0.340 | | |
| (Image Plane) | ∞ | | | | f1 = 2.35 mm
f2 = −3.01 mm
f3 = 4.97 mm
f12 = 4.96 mm
f23 = −6.24 mm
L13 = 2.445 mm

Aspheric Data

Second Surface k = 0.000, $A_4$ = 1.509E−02, $A_6$ = −2.582E−01, $A_8$ = 1.002, $A_{10}$ = −1.583
Third Surface k = 0.000, $A_4$ = 2.379E−02, $A_6$ = −8.082E−01, $A_8$ = 2.826, $A_{10}$ = −4.581
Fourth Surface k = 0.000, $A_4$ = −6.315E−01, $A_6$ = 2.666E−01, $A_8$ = 1.399E+01,
$A_{10}$ = −7.833E+01, $A_{12}$ = 1.823E+02, $A_{14}$ = −1.657E+02
Fifth Surface k = 0.000, $A_4$ = −1.248, $A_6$ = 3.316, $A_8$ = −2.896, $A_{10}$ = −4.269,
$A_{12}$ = 1.467E+01, $A_{14}$ = −1.081E+01
Sixth Surface k = −1.326E+01, $A_4$ = −4.296E−01, $A_6$ = 1.795E−01, $A_8$ = 9.618E−02,
$A_{10}$ = 2.308E−02, $A_{12}$ = −2.948E−01, $A_{14}$ = −3.504E−02,
$A_{16}$ = 1.706E−01
Seventh Surface k = 7.369E−01, $A_4$ = −2.599E−01, $A_6$ = 6.944E−02, $A_8$ = −1.588E−02,
$A_{10}$ = −9.679E−03, $A_{12}$ = 2.437E−03, $A_{14}$ = 2.126E−03,
$A_{16}$ = −9.322E−04

The values of the respective conditional expressions are as follows:

$f12/f23 = -0.79$ $D3/L13 = 0.42$ $f1/f2 = -0.78$ $Rf/Rr = -0.02$ $dA/dB = 1.73$

Accordingly, the imaging lens of Numerical Data Example 1 satisfies the conditional expressions (1) to (7), (6A), and (7A).

Figure 2:
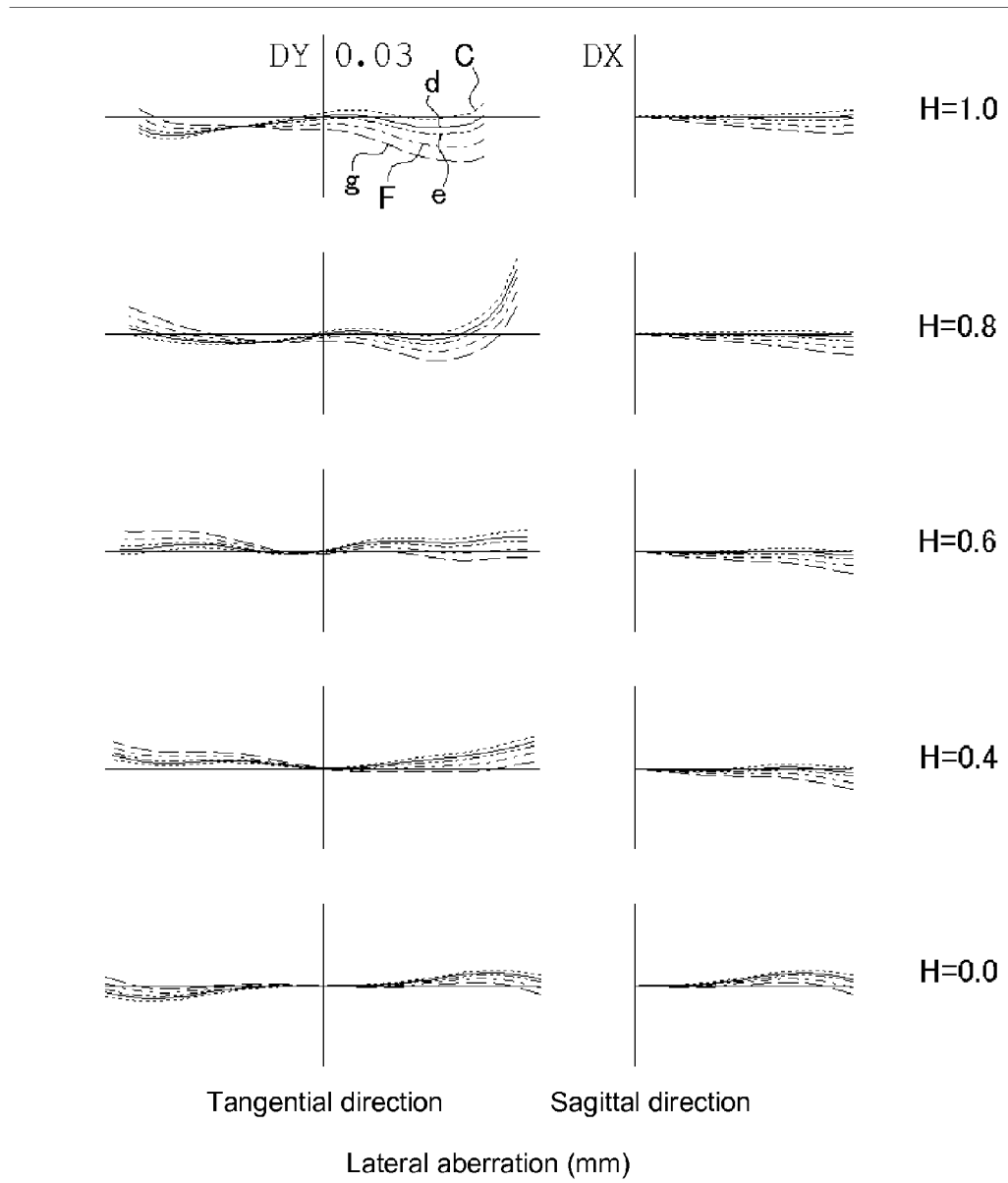
FIG. 2 is an aberration diagram showing a lateral aberration of the imaging lens of FIG. 1.
Figure 3:
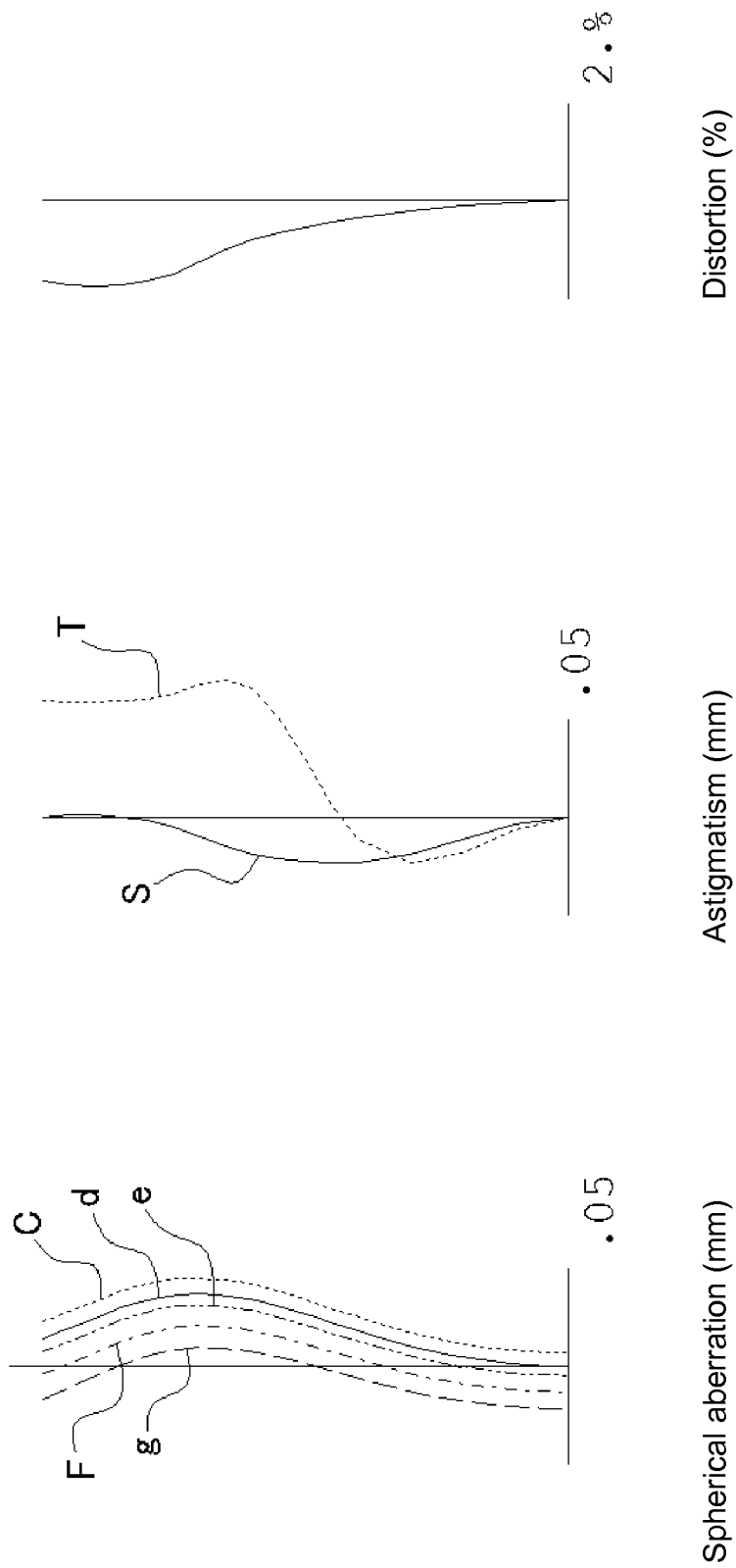
FIG. 3 is an aberration diagram showing a spherical aberration, an astigmatism, and a distortion of the imaging lens of FIG. 1.
Figure 4:
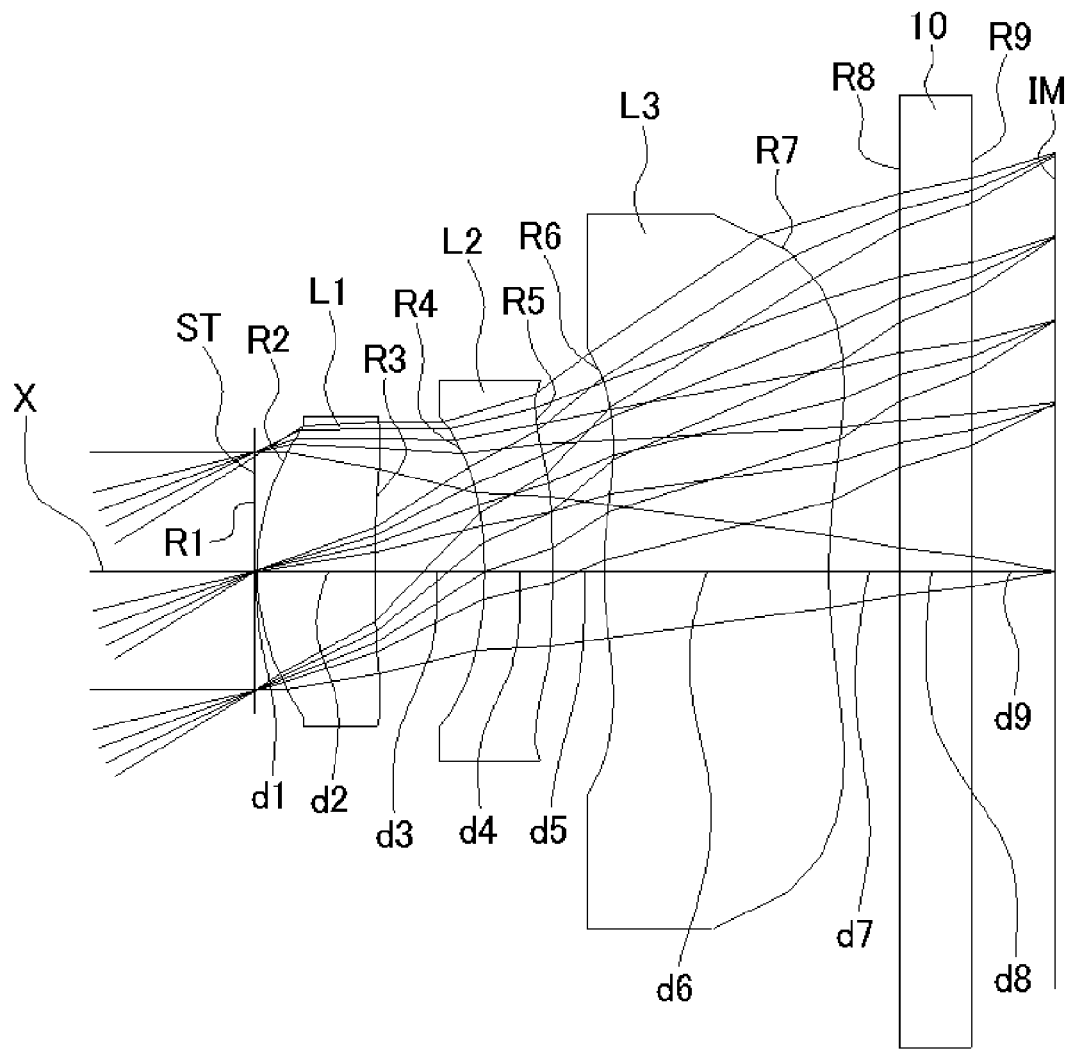
FIG. 4 is a sectional view showing a schematic configuration of an imaging lens of Numerical Data Example 2 according to the embodiment of the invention.

FIG. 2 shows the lateral aberration that corresponds to a ratio of each image height to the maximum image height (hereinafter referred to as "image height ratio H") in the imaging lens of Numerical Data Example 1 by dividing into a tangential direction and a sagittal direction (which is also the same in FIGS. 5, 8, 11, and 14). Furthermore, FIG. 3 shows a spherical aberration (mm), an astigmatism (mm), and a distortion (%) of the imaging lens of Numerical Data Example 1, respectively. In the aberration diagrams, aberrations at the respective wavelengths of a g line (435.84 nm), an F line (486.13 nm), an e line (546.07 nm), a d line (587.56 nm), and a C line (656.27 nm), are indicated for the lateral aberration diagrams and the spherical aberration diagram. Further, in the astigmatism diagram, the aberration on the sagittal image surface S and the aberration on the tangential image surface T are respectively indicated (which are the same in FIGS. 6, 9, 12, and 15). As shown in FIGS. 2 and 3, according to the imaging lens of Numerical Data Example 1, aberrations are satisfactorily corrected.

Numerical Data Example 2

Basic lens data are shown below.

f = 2.84 mm, Fno = 2.9, ω = 31.7°
Unit: mm

Surface Data

| Surface Number i | R | d | Nd | vd |
|---|---|---|---|---|
| (Object) | ∞ | ∞ | | |
| 1 (Stop) | ∞ | 0.010 | | |
| 2* | 1.044 | 0.493 | 1.5250 | 56.0 |
| 3* | 5.516 | 0.459 (=dA) | | |
| 4* | −1.873 (=Rf) | 0.285 | 1.6142 | 26.0 |
| 5* | 400.000 (=Rr) | 0.215 (=dB) | | |
| 6* | 1.385 | 0.944 (=D3) | 1.5250 | 56.0 |
| 7* | 2.189 | 0.300 | | |
| 8 | ∞ | 0.300 | 1.5163 | 64.1 |
| 9 | ∞ | 0.347 | | |
| (Image Plane) | ∞ | | | | f1 = 2.36 mm
f2 = −3.03 mm
f3 = 5.12 mm
f12 = 4.73 mm
f23 = −6.34 mm
L13 = 2.396 mm

Aspheric Data

Second Surface k = 0.000, $A_4$ = 2.309E−02, $A_6$ = −2.848E−01, $A_8$ = 9.845E−01, $A_{10}$ = −1.557

-continued f = 2.84 mm, Fno = 2.9, ω = 31.7°
Unit: mm

Third Surface k = 0.000, $A_4$ = 5.838E−02, $A_6$ = −8.978E−01, $A_8$ = 2.578, $A_{10}$ = −3.913
Fourth Surface k = 0.000, $A_4$ = −6.303E−01, $A_6$ = 1.125E−01, $A_8$ = 1.378E+01,
$A_{10}$ = −7.863E+01, $A_{12}$ = 1.811E+02, $A_{14}$ = −1.588E+02
Fifth Surface k = 0.000, $A_4$ = −1.265, $A_6$ = 3.276, $A_8$ = −2.877, $A_{10}$ = −4.312,
$A_{12}$ = 1.396E+01, $A_{14}$ = −9.223
Sixth Surface k = −1.625E+01, $A_4$ = −4.316E−01, $A_6$ = 1.787E−01, $A_8$ = 7.797E−02,
$A_{10}$ = −1.609E−04, $A_{12}$ = −2.866E−01, $A_{14}$ = −1.022E−02,
$A_{16}$ = 2.027E−01
Seventh Surface k = 6.889E−01, $A_4$ = −2.528E−01, $A_6$ = 6.700E−02, $A_8$ = −1.538E−02,
$A_{10}$ = −9.951E−03, $A_{12}$ = 2.211E−03, $A_{14}$ = 2.013E−03,
$A_{16}$ = −8.866E−04

The values of the respective conditional expressions are as follows:

$f12/f23 = -0.75$ $D3/L13 = 0.39$ $f1/f2 = -0.78$ $Rf/Rr = -0.01$ $dA/dB = 2.14$

Accordingly, the imaging lens of Numerical Data Example 2 satisfies the conditional expressions (1) to (7), (6A), and (7A).

Figure 5:
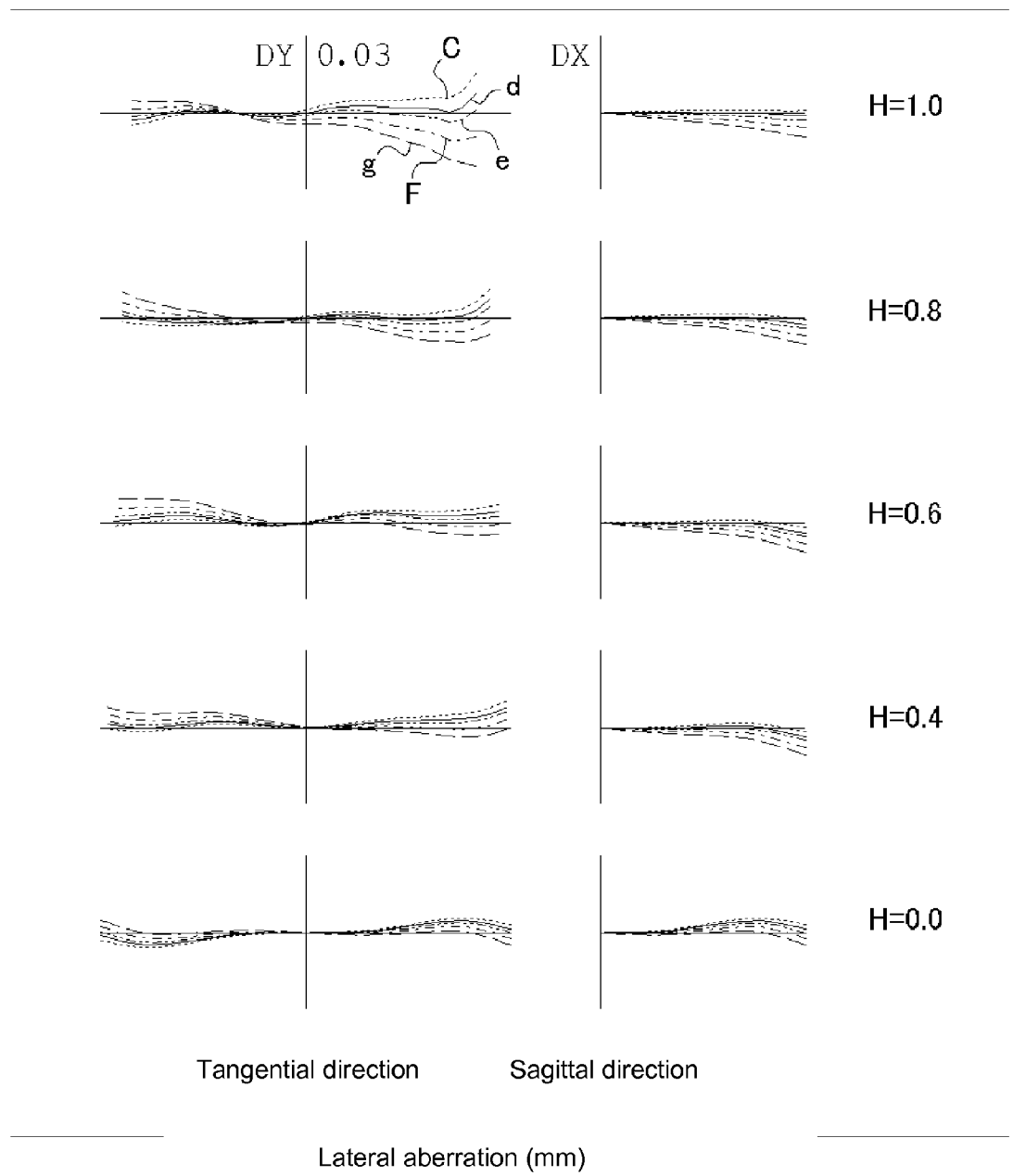
FIG. 5 is an aberration diagram showing a lateral aberration of the imaging lens of FIG. 4.
Figure 6:
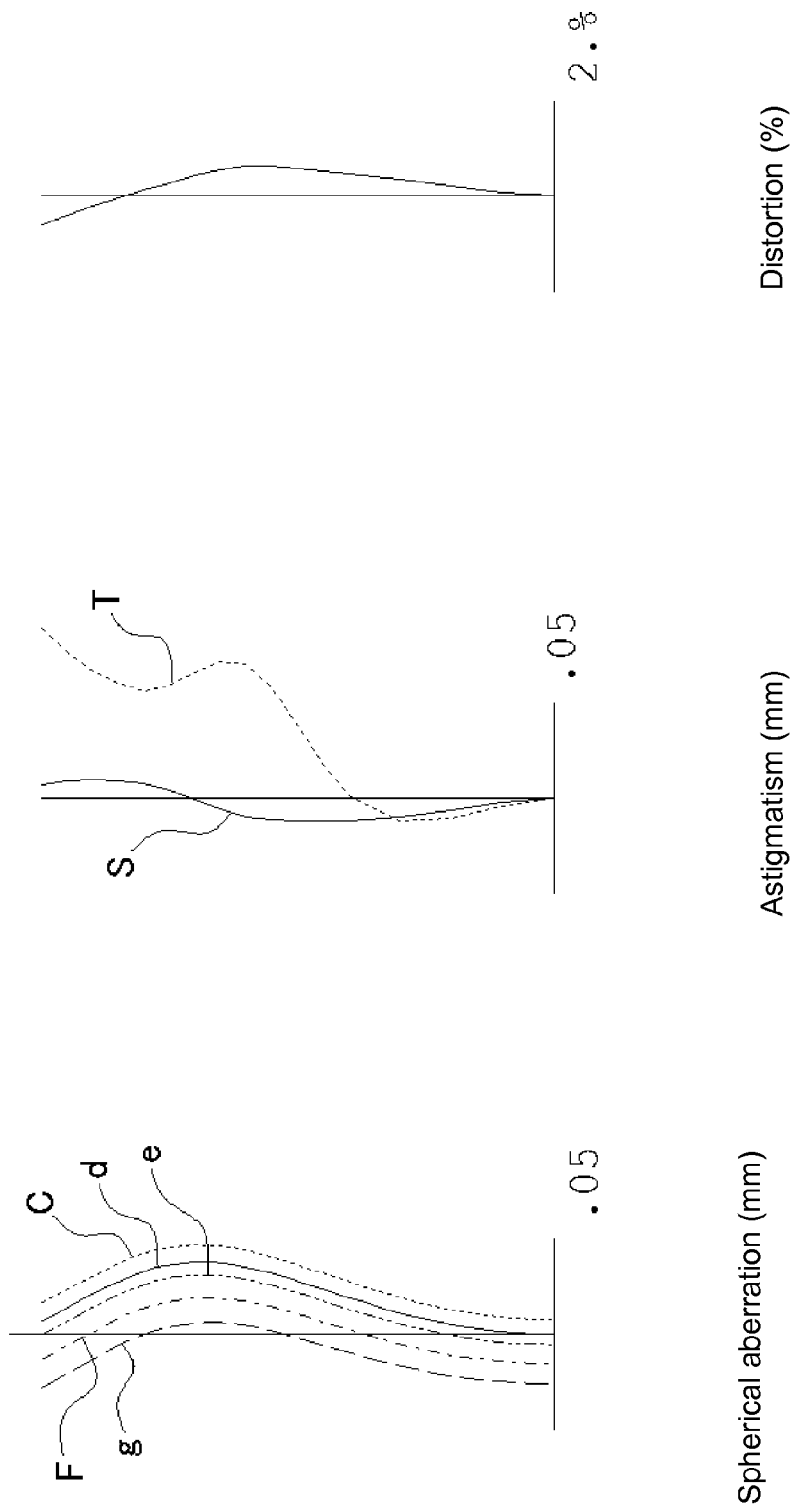
FIG. 6 is an aberration diagram showing a spherical aberration, an astigmatism, and a distortion of the imaging lens of FIG. 4.
Figure 7:
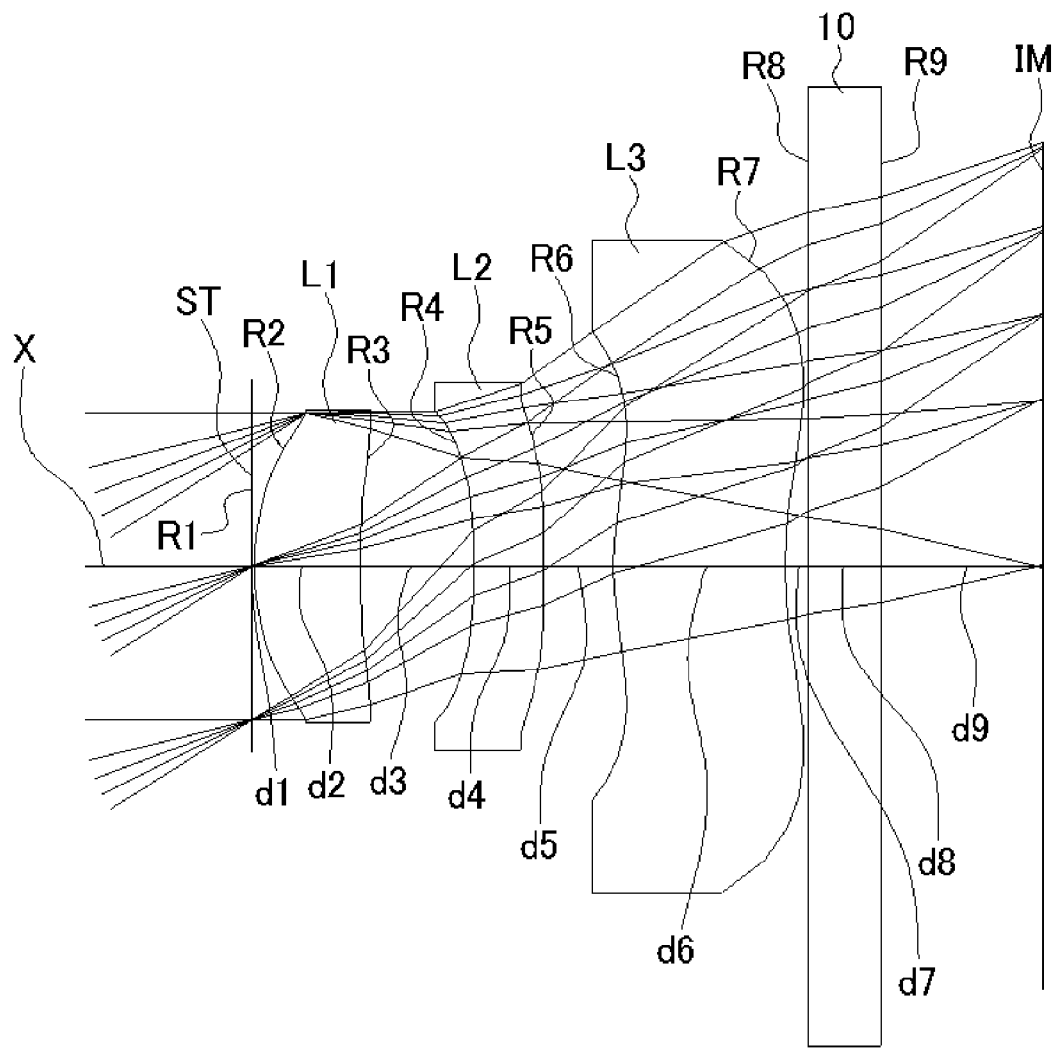
FIG. 7 is a sectional view showing a schematic configuration of an imaging lens of Numerical Data Example 3 according to the embodiment of the invention.

FIG. 5 shows the lateral aberration that corresponds to an image height ratio H, and FIG. 6 shows a spherical aberration (mm), an astigmatism (mm), and a distortion (%) of the imaging lens of Numerical Data Example 2, respectively. As shown in FIGS. 5 and 6, according to the imaging lens of Numerical Data Example 2, the image surface is satisfactorily corrected and aberrations are suitably corrected.

Numerical Data Example 3

Basic lens data are shown below.

f = 2.77 mm, Fno = 2.2, ω = 32.3°
Unit: mm

Surface Data

| Surface Number i | R | d | Nd | vd |
|---|---|---|---|---|
| (Object) | ∞ | ∞ | | |
| 1 (Stop) | ∞ | 0.010 | | |
| 2* | 1.037 | 0.442 | 1.5251 | 56.0 |
| 3* | 3.286 | 0.476 (=dA) | | |
| 4* | −3.453 (=Rf) | 0.289 | 1.6142 | 26.0 |
| 5* | 15.602 (=Rr) | 0.292 (=dB) | | |
| 6* | 1.254 | 0.715 (=D3) | 1.5251 | 56.0 |
| 7* | 1.814 | 0.100 | | |
| 8 | ∞ | 0.300 | 1.5163 | 64.1 |
| 9 | ∞ | 0.674 | | |
| (Image Plane) | ∞ | | | | f1 = 2.70 mm
f2 = −4.58 mm
f3 = 5.37 mm
f12 = 4.45 mm
f23 = −22.59 mm
L13 = 2.214 mm

Aspheric Data

Second Surface k = 0.000, $A_4$ = 2.303E−02, $A_6$ = −2.305E−01, $A_8$ = 7.870E−01,
$A_{10}$ = −1.130
Third Surface k = 0.000, $A_4$ = 3.875E−03, $A_6$ = −3.473E−01, $A_8$ = 1.110,
$A_{10}$ = −2.743, $A_{12}$ = 2.235, $A_{14}$ = −2.792
Fourth Surface k = 0.000, $A_4$ = −7.244E−01, $A_6$ = −2.783E−01, $A_8$ = 1.432E+01,
$A_{10}$ = −7.697E+01, $A_{12}$ = 1.702E+02, $A_{14}$ = −1.336E+02,
$A_{16}$ = −1.781E+01
Fifth Surface k = 0.000, $A_4$ = −1.237, $A_6$ = 2.916, $A_8$ = −3.664, $A_{10}$ = −9.759E−01,
$A_{12}$ = 9.582, $A_{14}$ = −7.084, $A_{16}$ = 2.008E−01
Sixth Surface k = −1.068E+01, $A_4$ = −3.921E−01, $A_6$ = 1.058E−01, $A_8$ = −6.539E−02,
$A_{10}$ = 1.254E−04, $A_{12}$ = 2.452E−03, $A_{14}$ = 9.836E−03, $A_{16}$ = 1.846E−02
Seventh Surface k = 0.000, $A_4$ = −3.132E−01, $A_6$ = 6.928E−02, $A_8$ = 1.309E−02,
$A_{10}$ = −3.238E−02, $A_{12}$ = −4.128E−04, $A_{14}$ = 1.087E−02,
$A_{16}$ = −3.547E−03

The values of the respective conditional expressions are as follows:

$f12/f23 = -0.20$ $D3/L13 = 0.32$ $f1/f2 = -0.59$ $Rf/Rr = -0.22$ $dA/dB = 1.63$

Accordingly, the imaging lens of Numerical Data Example 3 satisfies the conditional expressions (1) to (7), (6A), and (7A).

Figure 8:
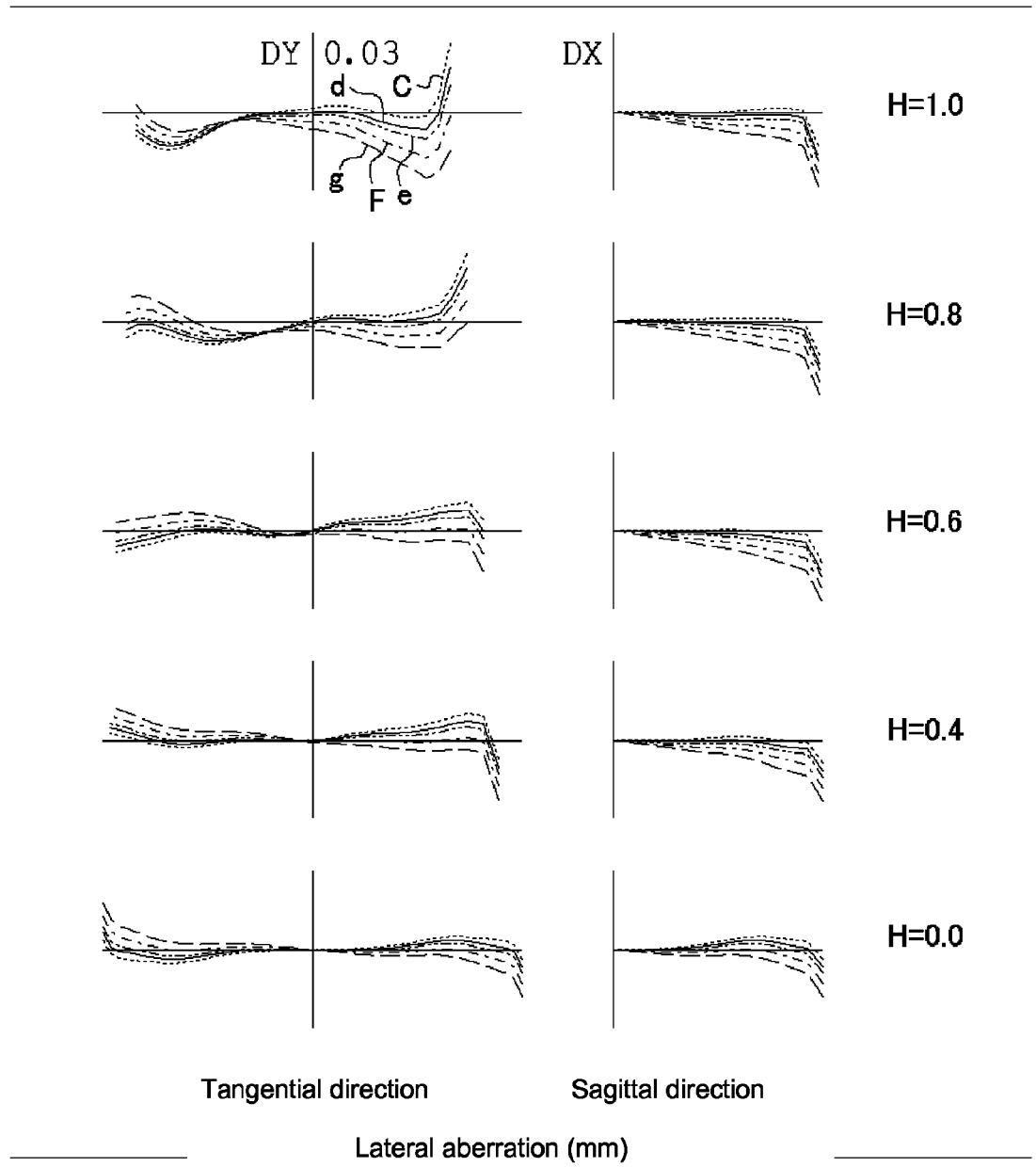
FIG. 8 is an aberration diagram showing a lateral aberration of the imaging lens of FIG. 7.
Figure 9:
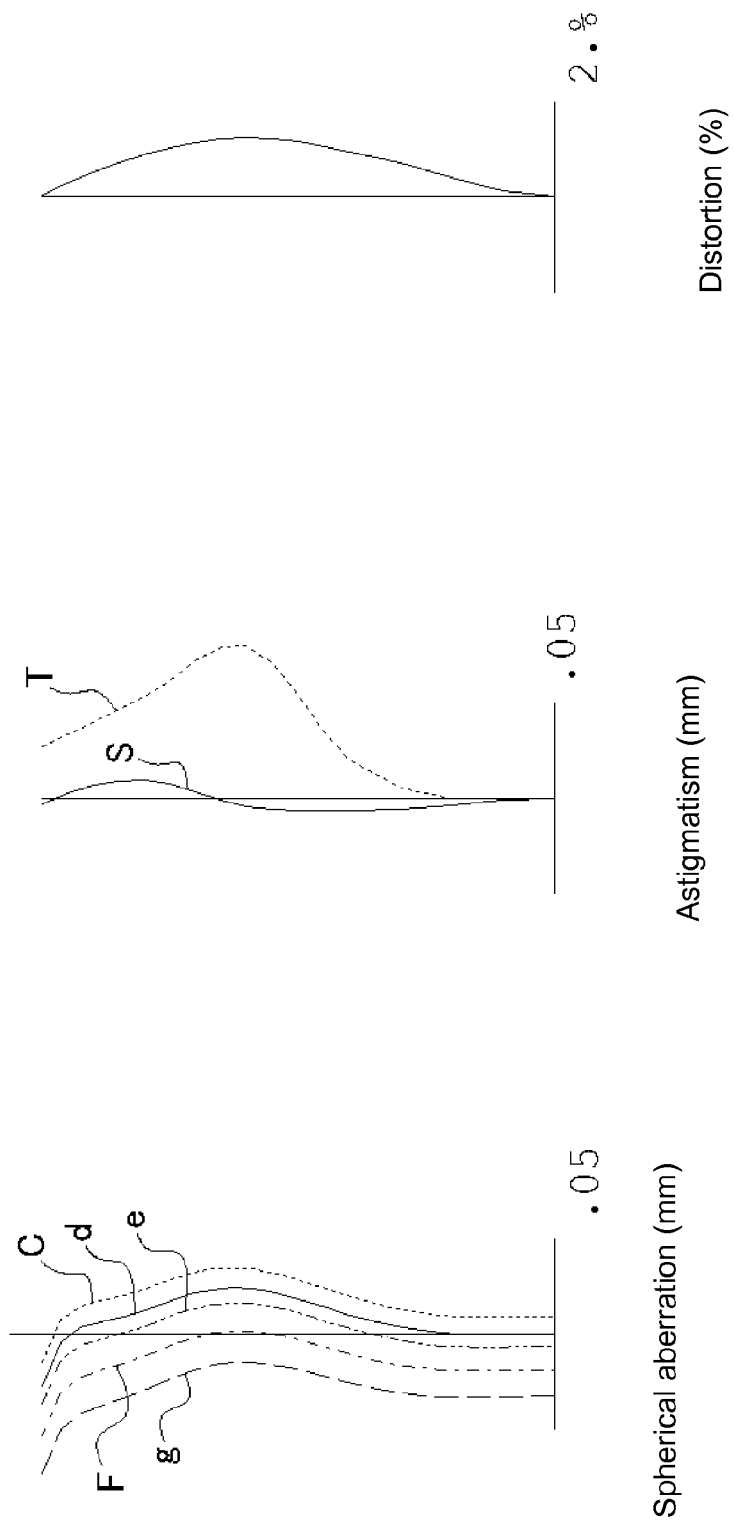
FIG. 9 is an aberration diagram showing a spherical aberration, an astigmatism, and a distortion of the imaging lens of FIG. 7.
Figure 10:
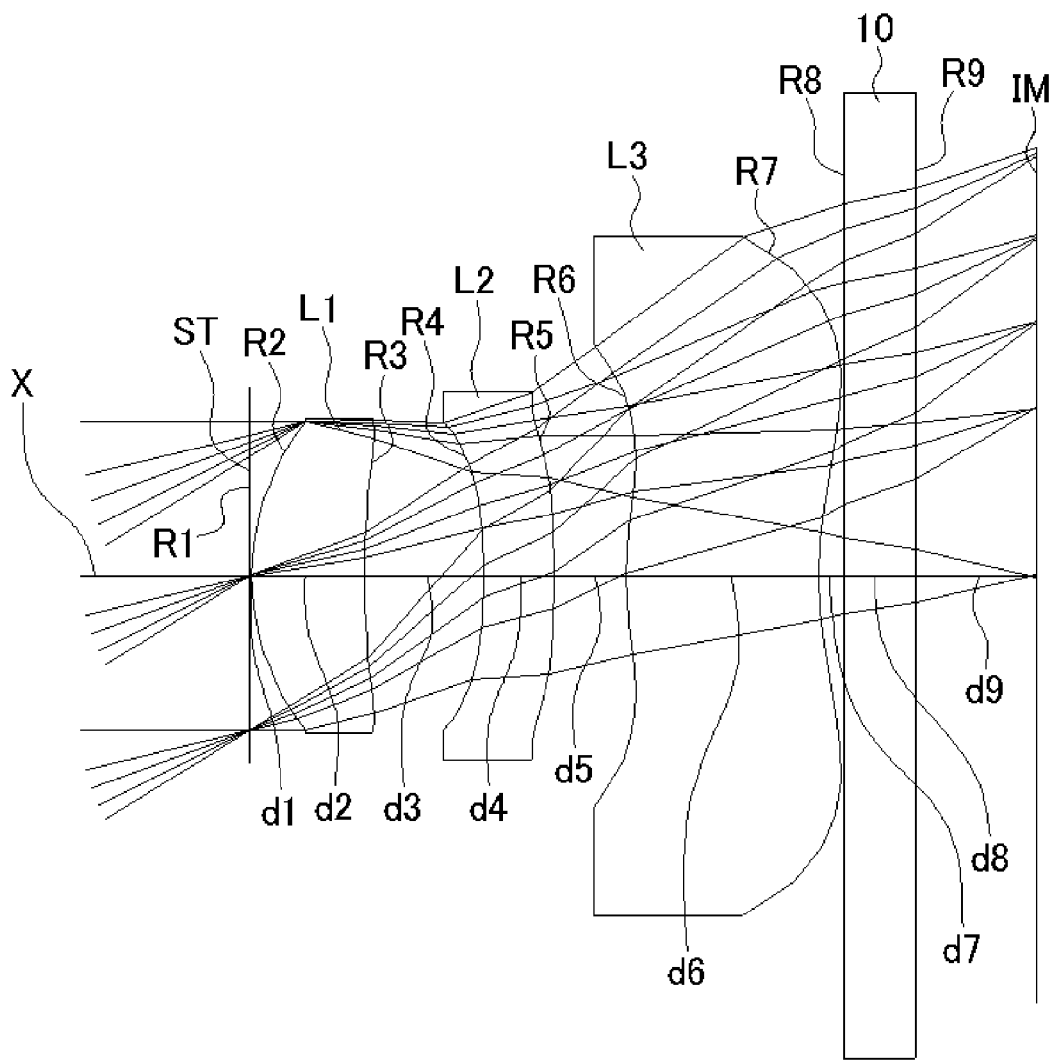
FIG. 10 is a sectional view showing a schematic configuration of an imaging lens of Numerical Data Example 4 according to the embodiment of the invention.

FIG. 8 shows the lateral aberration that corresponds to an image height ratio H, and FIG. 9 shows a spherical aberration (mm), an astigmatism (mm), and a distortion (%) of the imaging lens of Numerical Data Example 3, respectively. As shown in FIGS. 8 and 9, according to the imaging lens of Numerical Data Example 3, the image surface is satisfactorily corrected and aberrations are suitably corrected.

Numerical Data Example 4

Basic lens data are shown below.

| f = 2.85 mm, Fno = 2.2, ω = 31.5° Unit: mm | | | | |
|---|---|---|---|---|
| Surface Data | | | | |
| Surface Number i | R | d | Nd | vd |
| (Object) | ∞ | ∞ | | |
| 1 (Stop) | ∞ | 0.010 | | |
| 2* | 1.006 | 0.468 | 1.5251 | 56.0 |
| 3* | 3.705 | 0.493 (=dA) | | |
| 4* | −2.996 (=Rf) | 0.290 | 1.6142 | 26.0 |
| 5* | 42.855 (=Rr) | 0.301 (=dB) | | |
| 6* | 1.491 | 0.798 (=D3) | 1.5251 | 56.0 |
| 7* | 1.585 | 0.100 | | |
| 8 | ∞ | 0.300 | 1.5163 | 64.1 |
| 9 | ∞ | 0.502 | | |
| (Image Plane) | ∞ | | | | f1 = 2.48 mm
f2 = −4.55 mm
f3 = 12.21 mm
f12 = 3.80 mm
f23 = −5.97 mm
L13 = 2.350 mm

Aspheric Data

Second Surface $k = 0.000, A_4 = 1.191E-02, A_6 = -2.284E-01, A_8 = 7.890E-01, A_{10} = -1.164$ Third Surface $k = 0.000, A_4 = 1.310E-02, A_6 = -3.523E-01, A_8 = 1.107, A_{10} = -2.755, A_{12} = 2.303, A_{14} = -2.768$ Fourth Surface $k = 0.000, A_4 = -7.447E-01, A_6 = -2.700E-01, A_8 = 1.437E+01, A_{10} = -7.679E+01, A_{12} = 1.709E+02, A_{14} = -1.350E+02, A_{16} = -2.604E+01$ Fifth Surface $k = 0.000, A_4 = -1.217, A_6 = 2.922, A_8 = -3.628, A_{10} = -8.850E-01, A_{12} = 9.650, A_{14} = -7.188, A_{16} = -4.541E-02$ Sixth Surface $k = -1.386E+01, A_4 = -4.643E-01, A_6 = 1.032E-01, A_8 = -3.742E-02, A_{10} = 3.700E-03, A_{12} = 6.688E-03, A_{14} = 1.137E-02, A_{16} = 2.661E-02$ Seventh Surface $k = 0.000, A_4 = -3.548E-01, A_6 = 7.583E-02, A_8 = 1.624E-02, A_{10} = -3.585E-02, A_{12} = -1.212E-03, A_{14} = 1.097E-02, A_{16} = -3.207E-03$ The values of the respective conditional expressions are as follows:

$f12/f23 = -0.64$ $D3/L13 = 0.34$ $f1/f2 = -0.55$ $Rf/Rr = -0.07$ $dA/dB = 1.64$

Accordingly, the imaging lens of Numerical Data Example 4 satisfies the conditional expressions (1) to (7), (6A), and (7A).

Figure 11:
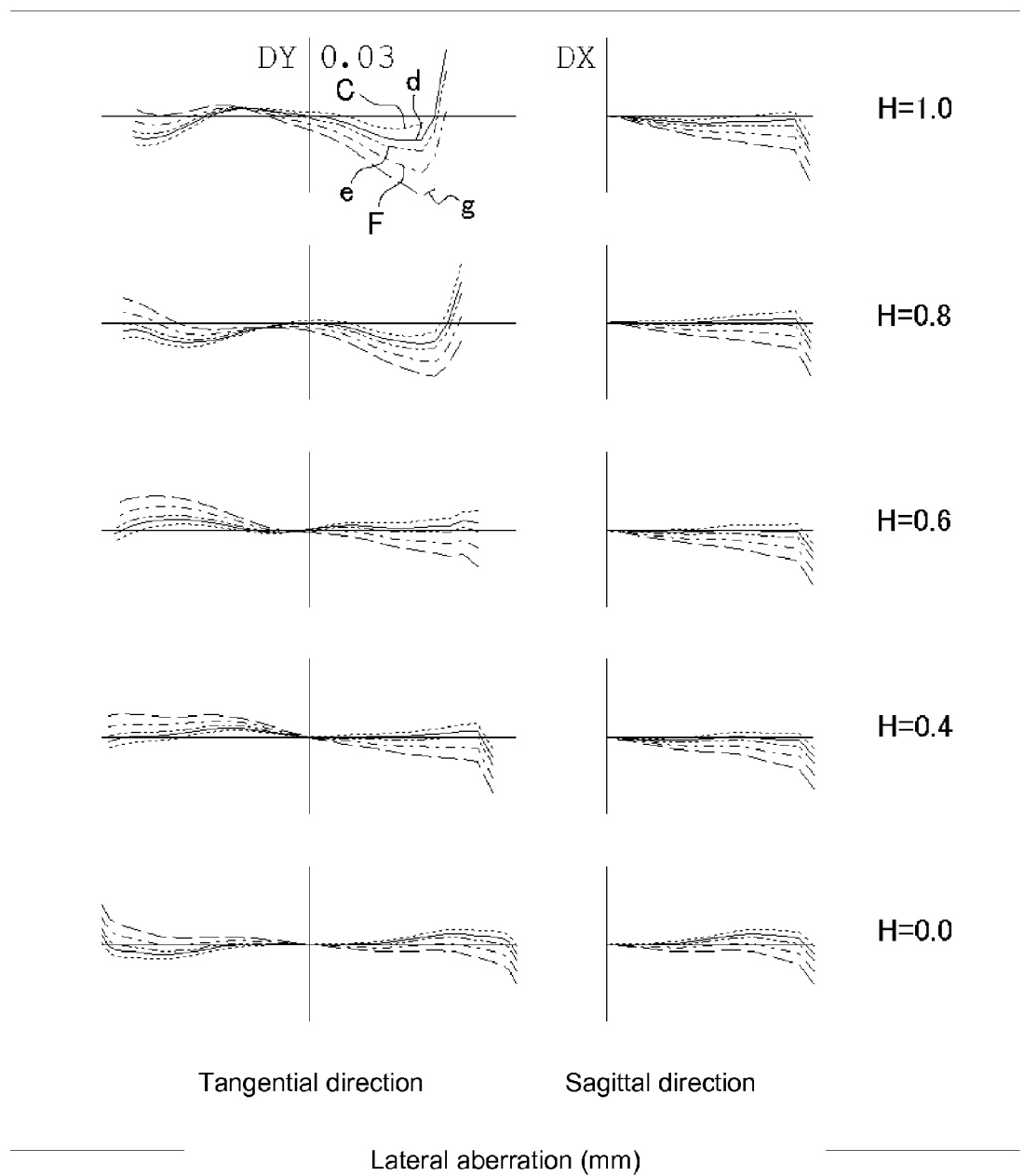
FIG. 11 is an aberration diagram showing a lateral aberration of the imaging lens of FIG. 10.
Figure 12:
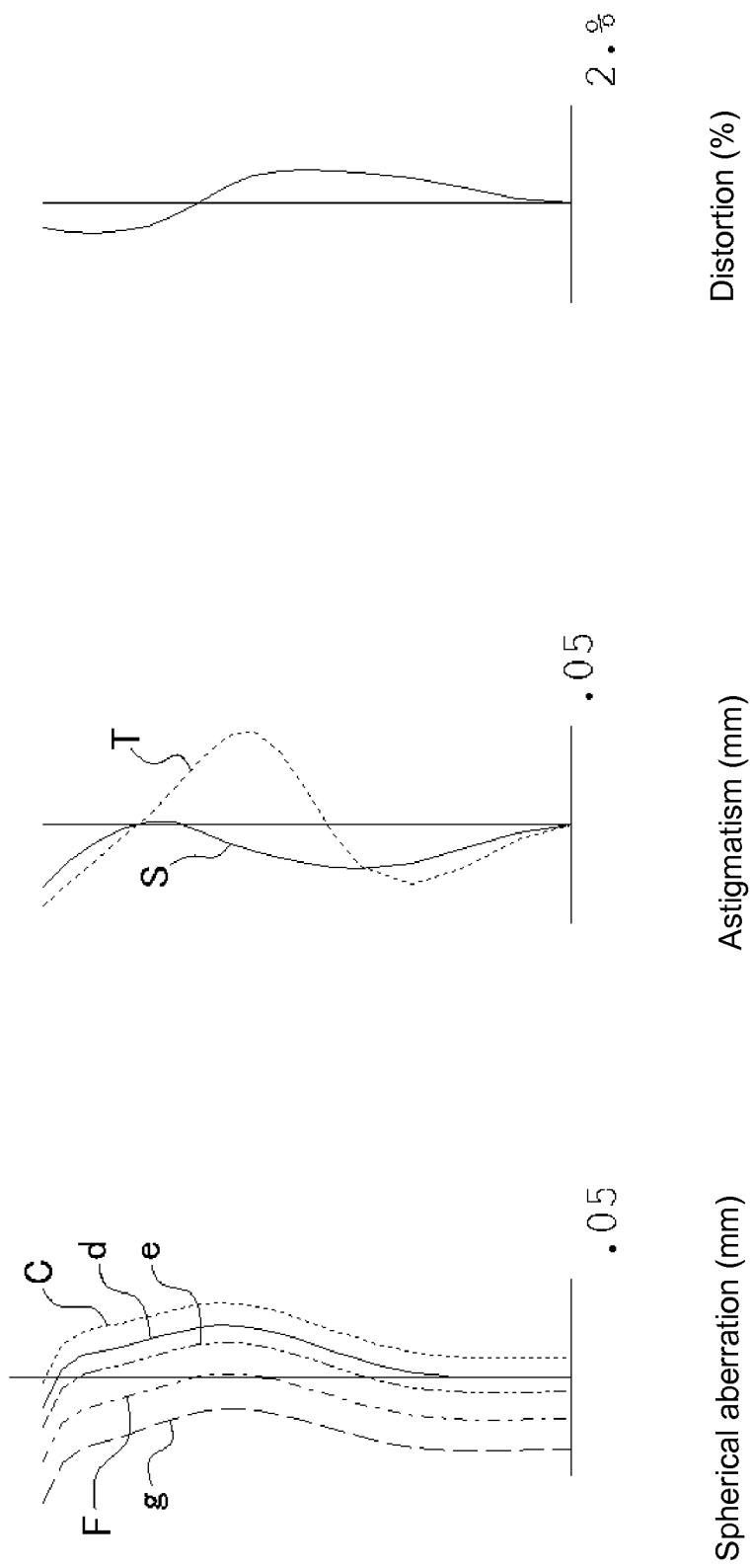
FIG. 12 is an aberration diagram showing a spherical aberration, an astigmatism, and a distortion of the imaging lens of FIG. 10.
Figure 13:
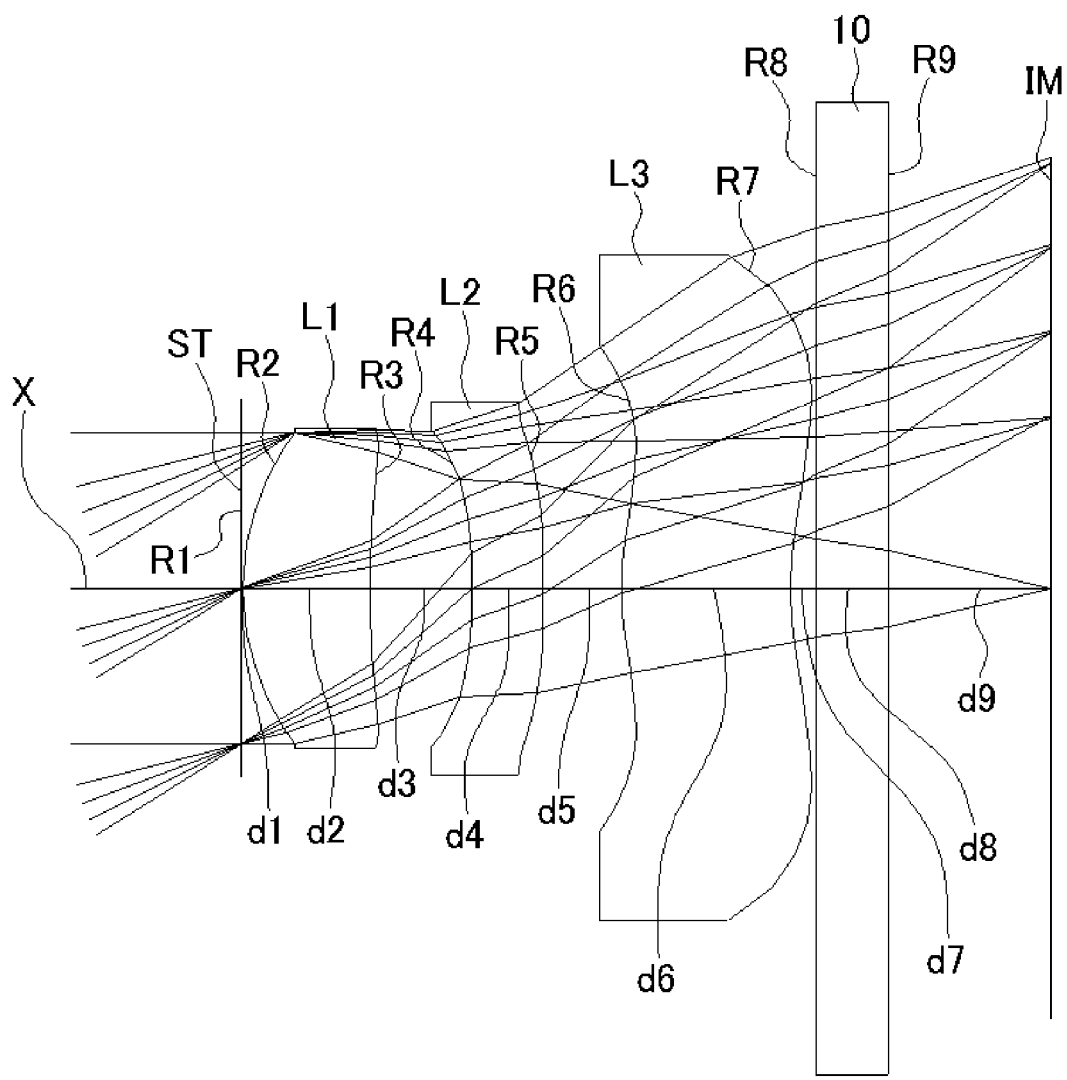
FIG. 13 is a sectional view showing a schematic configuration of an imaging lens of Numerical Data Example 5 according to the embodiment of the invention.

FIG. 11 shows the lateral aberration that corresponds to an image height ratio H, and FIG. 12 shows a spherical aberration (mm), an astigmatism (mm), and a distortion (%) of the imaging lens of Numerical Data Example 4, respectively. As shown in FIGS. 11 and 12, according to the imaging lens of Numerical Data Example 4, the image surface is satisfactorily corrected and aberrations are suitably corrected.

Numerical Data Example 5

Basic lens data are shown below.

| f = 2.84 mm, Fno = 2.2, ω = 31.7° Unit: mm | | | | |
|---|---|---|---|---|
| Surface Data | | | | |
| Surface Number i | R | d | Nd | vd |
| (Object) | ∞ | ∞ | | |
| 1 (Stop) | ∞ | 0.010 | | |
| 2* | 1.059 | 0.520 | 1.5251 | 56.0 |
| 3* | 3.484 | 0.423 (=dA) | | |
| 4* | −3.712 (=Rf) | 0.288 | 1.6142 | 26.0 |
| 5* | 18.543 (=Rr) | 0.325 (=dB) | | |
| 6* | 1.297 | 0.695 (=D3) | 1.5251 | 56.0 |
| 7* | 1.645 | 0.100 | | |
| 8 | ∞ | 0.300 | 1.5163 | 64.1 |
| 9 | ∞ | 0.666 | | |
| (Image Plane) | ∞ | | | | f1 = 2.70 mm
f2 = −5.01 mm
f3 = 6.92 mm
f12 = 4.20 mm
f23 = −14.21 mm
L13 = 2.251 mm

Aspheric Data

Second Surface $k = 0.000, A_4 = 2.122E-02, A_6 = -2.467E-01, A_8 = 7.469E-01, A_{10} = -1.056$ Third Surface $k = 0.000, A_4 = -1.157E-02, A_6 = -3.989E-01, A_8 = 1.022, A_{10} = -2.821, A_{12} = 2.338, A_{14} = -2.634$ Fourth Surface $k = 0.000, A_4 = -7.859E-01, A_6 = -2.902E-01, A_8 = 1.432E+01, A_{10} = -7.735E+01, A_{12} = 1.697E+02, A_{14} = -1.317E+02, A_{16} = -1.662E+01$ Fifth Surface $k = 0.000, A_4 = -1.218, A_6 = 2.868, A_8 = -3.680, A_{10} = -8.028E-01, A_{12} = 9.477, A_{14} = -7.365, A_{16} = 6.498E-01$ Sixth Surface $k = -8.395, A_4 = -4.092E-01, A_6 = 1.125E-01, A_8 = -5.610E-02, A_{10} = 4.718E-03, A_{12} = 2.809E-03, A_{14} = 1.501E-02, A_{16} = 6.365E-03$ Seventh Surface $k = 0.000, A_4 = -3.518E-01, A_6 = 8.036E-02, A_8 = 1.547E-02, A_{10} = -3.412E-02, A_{12} = -1.808E-03, A_{14} = 1.073E-02, A_{16} = -3.154E-03$ The values of the respective conditional expressions are as follows:

$$f12/f23=-0.30$$

$$D3/L13=0.31$$

$$f1/f2=-0.54$$

$$Rf/Rr=-0.20$$

$$dA/dB=1.30$$

Accordingly, the imaging lens of Numerical Data Example 5 satisfies the conditional expressions (1) to (7), (6A), and (7A).

Figure 14:
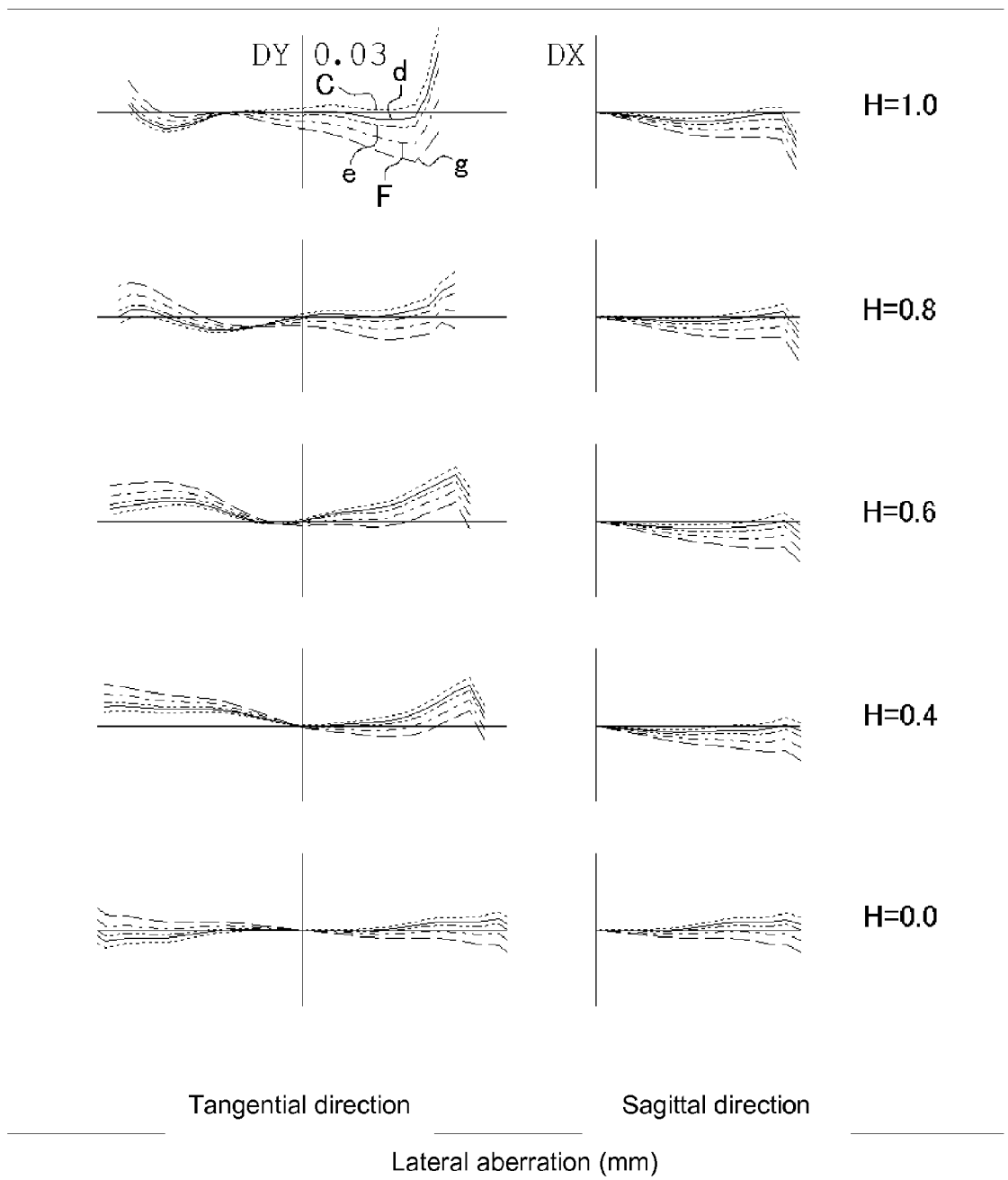
FIG. 14 is an aberration diagram showing a lateral aberration of the imaging lens of FIG. 13.
Figure 15:
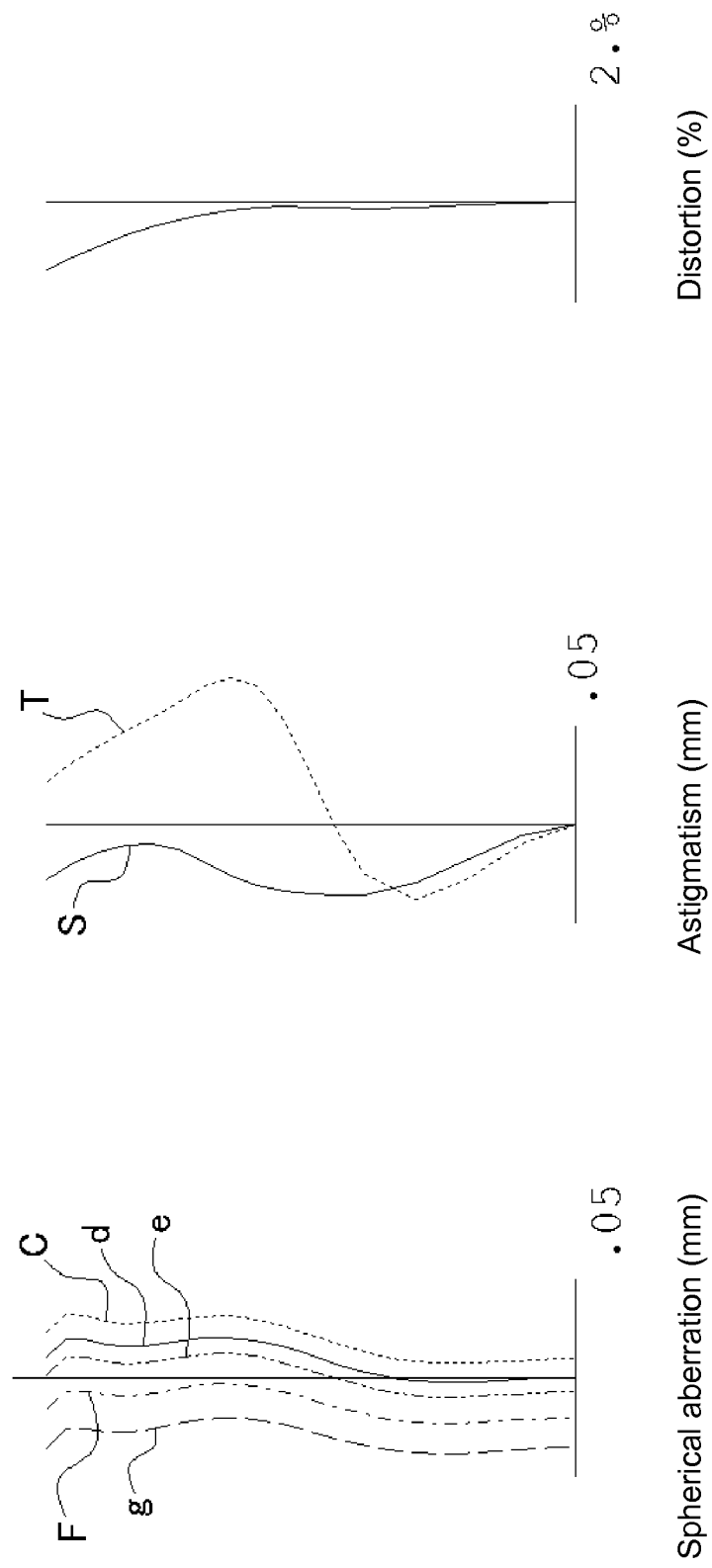
FIG. 15 is an aberration diagram showing a spherical aberration, an astigmatism, and a distortion of the imaging lens of FIG. 13.

FIG. 14 shows the lateral aberration that corresponds to an image height ratio H, and FIG. 15 shows a spherical aberration (mm), an astigmatism (mm), and a distortion (%) of the imaging lens of Numerical Data Example 5, respectively. As shown in FIGS. 14 and 15, according to the imaging lens of Numerical Data Example 5, the image surface is satisfactorily corrected and aberrations are suitably corrected.

With advancements in resolution of an imaging element, there has been a demand for an imaging lens to have wider angle of view. Mounting an imaging lens having a wide angle of view in a camera, it is not only possible to take an image in wide range, but also possible to cut out an image of a desired range (angle of view) with hardware and software after taking the image. When an imaging element of high resolution is used, the cut-out image also has sufficient resolution, so that it is possible to obtain an image that is as good as the image directly taken at desired angle of view. Therefore, this characteristic has been expected as a new additional value to a camera. The imaging lens of the embodiment has a relatively wide angle of view, so that it is also possible to well meet such demand.

Moreover, in case of an imaging element of high resolution, since a light receiving area of each pixel is small, an image taken tends to be dark. As a method of correcting such darkness, there is a method of improving a light-receiving sensitivity of an imaging element using an electric circuit. However, if the light receiving sensitivity is increased, noise components that directly do not contribute to image formation are also amplified, so that in many cases, a circuit to reduce noises is additionally required. Since the imaging lens of the embodiment has relatively small F number, it is possible to obtain an image that is bright enough without such electric circuit.

Therefore, when the imaging lens of the embodiment is applied in an imaging optical system such as cellular phones, digital still cameras, portable information terminals, security cameras, onboard cameras, and network cameras, it is possible to attain both high performance and miniaturization of the cameras.

Here, the imaging lens of the invention is not limited to the embodiment described above. In the above-described embodiment, any of the first lens L1 to the third lens L3 is formed as an aspheric surface, but it is not necessary to form all the surfaces as aspheric surfaces.

The present invention is applicable to an imaging lens for mounting in a device that requires having a small size and satisfactory aberration correction performance, e.g. an imaging lens for mounting in a device such as cellular phones and digital still cameras.

The disclosure of Japanese Patent Application No. 2011-180494, filed on Aug. 22, 2011, is incorporated in the application by the reference.

While the invention has been explained with reference to the specific embodiments of the invention, the explanation is illustrative and the invention is limited only by the appended claims.

What is claimed is:

1. An imaging lens, comprising:
a first lens having positive refractive power;
a second lens having negative refractive power; and
a third lens having positive refractive power arranged in the order from an object side to an image plane side,
wherein said first lens has a shape so that a curvature radius of a surface thereof on the object side and a curvature radius of a surface thereof on the image plane side are both positive,
said second lens has a shape so that a curvature radius of a surface thereof on the object side is negative and a curvature radius of a surface thereof on the image plane side is positive,
said third lens has a shape so that a curvature radius of a surface thereof on the object side and a curvature radius of a surface thereof on the image plane side are both positive,
said first lens has a focal length f1,
said second lens has a focal length f2,
said third lens has a focal length f3,
said first lens and said second lens have a composite focal length f12, and
said second lens and said third lens have a composite focal length f23 so that the following conditional expressions are satisfied:

$$f1<|f2|$$

$$f1<f3$$

$$-1.0<f12/f23<-0.1.$$

2. The imaging lens according to claim 1, wherein said third lens has a thickness D3 on an optical axis, and said first lens has the surface on the object side being away from the surface of the third lens on the image plane side by a distance L13 on the optical axis so that the following conditional expression is satisfied:

$$0.25<D3/L13<0.5.$$

3. The imaging lens according to claim 1, wherein said first lens has the focal length f1 and said second lens has the focal length f2 so that the following conditional expression is satisfied:

$$-1.0<f1/f2<-0.5.$$

4. The imaging lens according to claim 1, wherein said second lens has the surface on the object side having a curvature radius Rf and the surface on the image plane side having a curvature radius Rr so that the following conditional expression is satisfied:

$$-0.30<Rf/Rr<0.$$

5. The imaging lens according to claim 1, wherein said first lens is arranged to be away from the second lens by a distance dA on the optical axis, and said second lens is arranged to be away from the third lens by a distance dB on the optical axis so that the following conditional expression is satisfied:

$$1.0<dA/dB<3.0.$$

* * * * *